United States Patent
Kawase et al.

(10) Patent No.: US 6,852,009 B2
(45) Date of Patent: Feb. 8, 2005

(54) POLISHING COMPOSITION AND POLISHING METHOD EMPLOYING IT

(75) Inventors: Akihiro Kawase, Aichi (JP); Masao Okamura, Aichi (JP); Yutaka Inoue, Aichi (JP)

(73) Assignee: Fujimi Incorporated, Nishikasugai-gun (JP)

(*) Notice: Subject to any disclaimer, the term of this patent is extended or adjusted under 35 U.S.C. 154(b) by 94 days.

(21) Appl. No.: 10/060,198

(22) Filed: Feb. 1, 2002

(65) Prior Publication Data

US 2002/0151252 A1 Oct. 17, 2002

(30) Foreign Application Priority Data

Feb. 2, 2001 (JP) ....................... 2001-027276

(51) Int. Cl.[7] ............... B02B 1/00; B08B 7/00; C09C 1/68
(52) U.S. Cl. ............... 451/36; 51/309; 106/3; 252/180; 451/41
(58) Field of Search ............ 51/307, 308, 309; 106/3; 252/180; 438/690, 691, 692, 693; 451/36, 41, 59, 63; 526/93; 216/88, 89

(56) References Cited

U.S. PATENT DOCUMENTS

| | | | |
|---|---|---|---|
| 4,169,337 A | 10/1979 | Payne | |
| 4,462,188 A | 7/1984 | Payne | |
| 4,588,421 A | 5/1986 | Payne | |
| 5,084,071 A | * 1/1992 | Nenadic et al. | ......... 51/309 |
| 5,230,833 A | 7/1993 | Romberger et al. | |
| 5,916,819 A | 6/1999 | Skrovan et al. | |
| 6,099,604 A | 8/2000 | Sandhu et al. | |
| 6,280,652 B1 | 8/2001 | Inoue et al. | |
| 6,440,856 B1 | * 8/2002 | Bessho et al. | ......... 438/691 |
| 6,454,820 B2 | * 9/2002 | Hagihara et al. | ......... 51/308 |
| 6,569,216 B1 | * 5/2003 | Taira et al. | ......... 51/309 |

FOREIGN PATENT DOCUMENTS

| | | |
|---|---|---|
| EP | 0 401 147 | 12/1990 |
| EP | 1 006 166 | 6/2000 |
| GB | 2 341 190 | 3/2000 |
| GB | 2 354 526 | 3/2001 |
| JP | 63-272460 | 11/1988 |
| JP | 2000-073049 | 3/2000 |
| JP | 2000-173956 | 6/2000 |
| JP | 2001-077063 | 3/2001 |
| JP | 2001-288455 | 10/2001 |
| JP | 2002-075929 | 3/2002 |
| WO | WO 99/32570 | 7/1999 |
| WO | WO 00/24842 | 5/2000 |

* cited by examiner

Primary Examiner—Timothy V. Eley
(74) Attorney, Agent, or Firm—Oblon, Spivak, McClelland, Maier & Neustadt, P.C.

(57) ABSTRACT

A polishing composition which comprises the following components (a) to (d):

Figure 1:
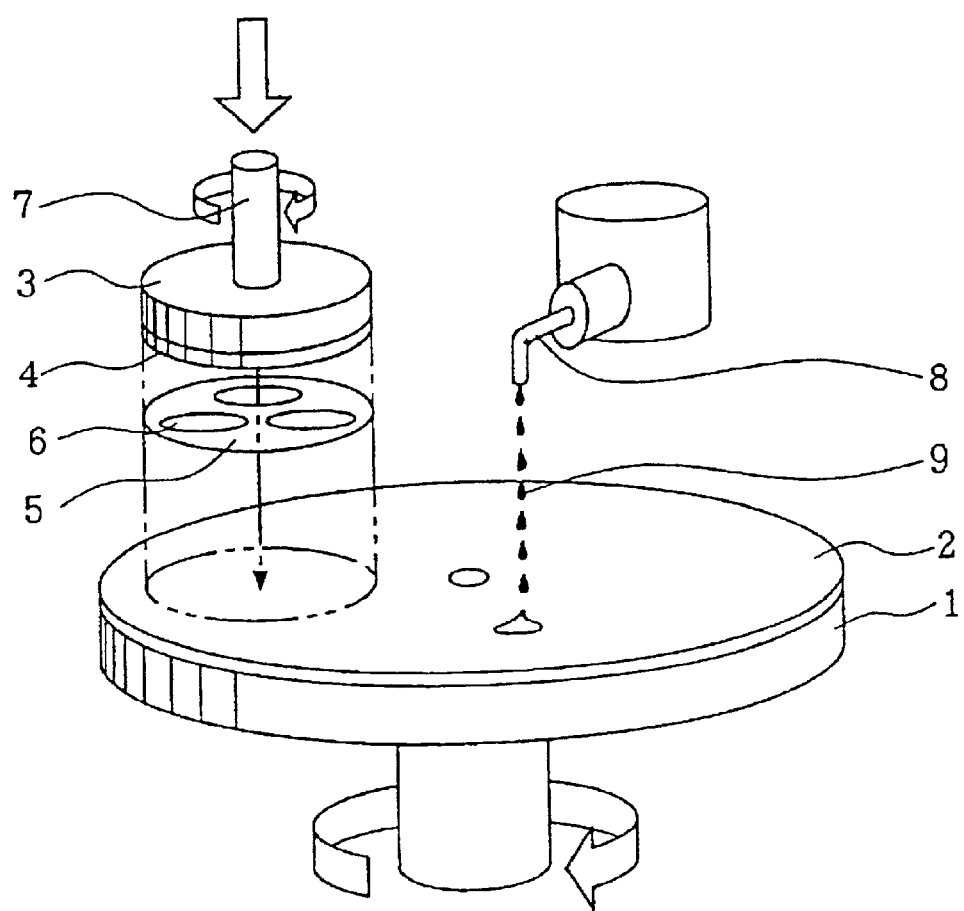

(a) silicon dioxide,
(b) at least one basic substance selected from the group consisting of an inorganic salt of an alkali metal, an ammonium salt, piperazine and ethylenediamine,
(c) at least one chelating agent selected from the group consisting of a compound represented by the following general formula [1] and its salt:

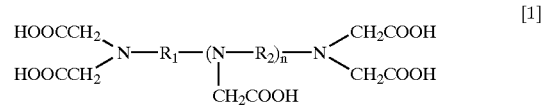

wherein each of $R_1$ and $R_2$ which are the same or different, is a lower alkylene group, and n is an integer of from 0 to 4, and (d) water.

17 Claims, 1 Drawing Sheet

POLISHING COMPOSITION AND POLISHING METHOD EMPLOYING IT

The present invention relates to a polishing composition capable of efficiently preventing metal staining of an object to be polished. More particularly, it relates to a polishing composition capable of efficiently preventing staining of an object to be polished due to transition metals in polishing of a single-crystal silicon wafer, an epitaxial wafer or a semiconductor device, or a polysilicon thin film, a silicon oxide thin film or a silicon nitride thin film to be used in production process thereof, or a semiconductor element such as a solar cell using single-crystal silicon, poly-crystal silicon or amorphous silicon, and a polishing method capable of efficiently preventing metal staining of an object to be polished by employing such a composition.

In polishing of a semiconductor substrate, usually a so-called chemical mechanical polishing (mechanochemical processing) is carried out by means of a polishing composition having fine abrasive grains of a metal oxide uniformly dispersed in water and having an additive such as a chemical polishing accelerator added thereto.

In processing of a semiconductor substrate particularly a semiconductor wafer comprising single-crystal silicon, poly-crystal silicon, silicon oxide or silicon nitride, very high precision and few damages are required, and accordingly various polishing compositions have conventionally been employed.

With respect to an abrasive and a mirror surface polishing method for a semiconductor wafer, JP-B-49-13665 discloses a polishing method by means of a silica sol containing from about 2 to about 50% of solid content having final particle sizes of from about 2 to about 100 μm, in order to impart high surface completeness of a semiconductor. Further, U.S. Pat. No. 4,169,337 discloses a method for polishing a silicon wafer or a similar material by means of a water soluble colloidal silica or gel having from 0.1 to 5wt % (based on $SiO_2$ of sol) of a water soluble amine added thereto.

Further, JP-B-61-38954 discloses a method for polishing a silicon wafer by means of an abrasive comprising a sol or gel of water soluble colloidal silica containing, based on the silica content of the sol or gel, from 0.1 to 5wt % of a water soluble alkylamine or water soluble aminoalkylethanolamine containing from 2 to 8 carbon atoms, and from 0.1 to 5wt % of a salt of a water soluble quaternary alkyl ammonium containing at most 6 carbon atoms or a base.

JP-A-63-272460 discloses a polishing composition for a wafer containing water, granular amorphous silica and a water soluble chelating agent and/or high polymer ions having a molecular weight of at least 5,000, and having the pH adjusted to at least 9. JP-A-3-202269 discloses a colloidal silica slurry containing colloidal silica having from 0 to 200 ppm of sodium and metal content based on silica, a bactericide and a biocide, and further containing a polishing rate accelerator.

With such a polishing composition, it is possible to form the surface of a semiconductor wafer to a mirror surface having a high precision and few damages. Further, in order to prevent attachment of metal impurities on the semiconductor surface, particularly attachment of sodium on a semiconductor substrate, a composition containing no sodium has been used, or an additive to prevent attachment of sodium on the wafer surface has been studied as disclosed in JP-A-63-272460, and various methods have been studied to remove attached metals by washing. Further, by later improvement of wafer washing technology, a method of removing sodium attached on the wafer surface at the time of polishing has been studied, and washing after the polishing is believed to be more effective to decrease such sodium impurities at present.

However, such a polishing composition usually contains from several to several tens ppb or more of metal impurities consisting of transition metals such as copper (Cu), iron (Fe), nickel (Ni) and chromium (Cr). Such metal impurities are attached on the semiconductor wafer surface easily in an alkali solution. The attached metal impurities, particularly copper, has a high diffusion coefficient, and easily diffuses into the inside of crystals of the semiconductor wafer even at room temperature or at a temperature at the time of polishing (30–50° C.). It has been clear that the metal impurities diffused into the inside of the crystals can not be removed by washing after the polishing, whereby they deteriorate quality of the semiconductor wafer and decrease properties of a device employing such a semiconductor wafer.

In order to cope with metal staining of a semiconductor wafer due to the above silica-containing polishing composition, a method of using a highly purified polishing composition is considered. JP-A-11-214338 discloses an example wherein a semiconductor wafer is polished by using a colloidal silica having contents of iron, chromium, nickel, aluminum and copper of less than 1 ppb, respectively. However, such a highly purified polishing composition is expensive in general, such being problematic in view of cost for polishing.

Further, metal staining is inevitable to some extent practically from a polishing pad, a polishing apparatus, a container for storage, a piping or the like at the time of polishing of a semiconductor wafer, even if a composition having a high purity is used. Particularly in a case where a once used polishing composition is recycled from economical and environmental viewpoint, staining from such an apparatus tends to be remarkable, and it tends to be difficult to prevent metal staining of a semiconductor wafer even if a highly purified composition is used, such being problematic.

As mentioned above, a polishing composition has been required which can effectively prevent staining particularly due to transition metals such as copper, iron, nickel and chromium, in a field in which metal staining should be avoided, such as polishing of a semiconductor wafer or production of a device employing it.

The present invention has been made to overcome the above problems, and it is an object of the present invention to provide a polishing composition capable of effectively preventing staining of an object to be polished due to metal impurities, particularly due to transition metals such as copper, iron, nickel and chromium, and a polishing method employing it.

The present invention provides a polishing composition which comprises (a) silicon dioxide, (b) at least one basic substance selected from the group consisting of an inorganic salt of an alkali metal, an ammonium salt, piperazine and ethylenediamine, (c) at least one chelating agent selected from the group consisting of a compound represented by the following general formula [1] and its salt:

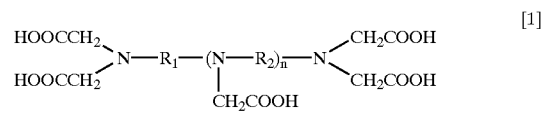

wherein each of $R_1$ and $R_2$ which are the same or different, is a lower alkylene group, and n is an integer of from 0 to 4, and (d) water.

The present invention further provides the above polishing composition wherein the silicon dioxide as the component (a) is colloidal silica, said colloidal silica has an average particle size of from 0.003 to 1 μm, and its concentration is from 0.05 to 30% based on the total weight of the polishing composition.

The present invention further provides the above polishing composition wherein the concentration of the basic substance as the component (b) is from 0.01 to 10% based on the total weight of the polishing composition, and the inorganic salt of an alkali metal is at least one member selected from the group consisting of lithium hydroxide, sodium hydroxide, potassium hydroxide, lithium carbonate, sodium carbonate, potassium carbonate, lithium hydrogen carbonate, sodium hydrogen carbonate and potassium hydrogen carbonate.

The present invention further provides the above polishing composition wherein the ammonium salt is at least one member selected from the group consisting of ammonium hydroxide, ammonium carbonate, ammonium hydrogen carbonate, tetramethylammonium hydroxide, tetraethylammonium hydroxide, tetramethylammonium chloride and tetraethylammonium chloride, and the chelating agent as the component (c) is at least one member selected from the group consisting of propanediaminetetraacetic acid, diethylenetriaminepentaacetic acid and triethylenetetraminehexaacetic acid.

The present invention still further provides a method for polishing a semiconductor wafer, wherein the above polishing composition is used to prevent staining of an object to be polished due to transition metals at the time of polishing, and the polishing method wherein the semiconductor wafer is at least one member selected from the group consisting of single-crystal silicon, poly-crystal silicon, silicon oxide and silicon nitride.

Now, the present invention will be described in detail with reference to the preferred embodiments.

In the accompanying drawing:

FIG. 1 is an oblique view illustrating a polishing apparatus used for polishing in Examples and Comparative Examples of the present invention.

According to the polishing composition of the present invention, it becomes possible to efficiently prevent staining of an object to be polished at the time of polishing due to metals, particularly transition metals such as copper, iron, nickel and chromium. Further, according to the polishing method of the present invention, it becomes possible to efficiently prevent staining of a semiconductor wafer comprising at least one member selected from the group consisting of single-crystal silicon, poly-crystal silicon, silicon oxide and silicon nitride, due to metals, particularly transition metals such as copper, iron, nickel and chromium, at the time of polishing.

Silicon Dioxide

In the present invention, silicon dioxide is employed as an abrasive. It has been known that polishing by some of known metal oxide abrasive grains are effective as an abrasive for grinding or polishing of a semiconductor wafer, but silicon dioxide is suitable as an abrasive in the polishing composition of the present invention.

Further, as silicon dioxide, colloidal silica, fumed silica, precipitated silica and various silica having different properties are known, and any one of them may be used. However, a colloidal silica having a uniform and small particle size is preferred to polish the semiconductor surface with particularly high precision.

The average particle size of the silicon dioxide is an average particle size as obtained from the specific surface area measured by BET method, and is usually from 0.003 to 1 μm, preferably from 0.01 to 0.5 μm, most preferably from 0.01 to 0.3 μm. Further, it is preferred that no particles exceeding 10 μm are contained in the abrasive. Further, the proportion of the silicon dioxide by weight is usually from 0.05 to 30%, preferably from 0.1 to 5%, more preferably from 0.5 to 2%, based on the total weight of the polishing composition. At least 0.05% of the silicon dioxide is required to increase polishing efficiency and polishing performance, however, if it exceeds 30%, the silicon dioxide concentration is excessive, the stability of the entire composition tends to be low, and separation, precipitation or gelation may take place, and a composition having such a concentration is impractical.

Basic Substance

The polishing composition of the present invention contains a basic substance. Such a basic substance functions as a polishing accelerator. The polishing accelerator is literally to accelerate polishing of an object to be polished, and it has a chemical polishing function such as erosion, etching or surface oxidation and aids mechanical polishing by abrasive grains, whereas the abrasive is for mechanical polishing. The basic substance in the present invention must not inhibit the effect of a chelating agent as described hereinafter. Namely, an ethanol amine such as monoethanol amine or aminoethyl ethanol amine which has conventionally been used as a polishing accelerator, inhibits the effect of a chelating agent as described hereinafter and is thereby unfavorable in the present invention.

Suitable as the basic substance to be used in the present invention is an inorganic salt of an alkali metal, an ammonium salt, piperazine or ethylene diamine.

The salt of an alkali metal may, for example, be a hydroxide or carbonate of an alkali metal. Specifically, lithium hydroxide, sodium hydroxide, potassium hydroxide, lithium carbonate, sodium carbonate, potassium carbonate, lithium hydrogen carbonate, sodium hydrogen carbonate, potassium hydrogen carbonate or the like is preferred, and sodium hydroxide or potassium hydroxide is particularly preferred.

As the ammonium salt, a quaternary ammonium salt is preferred in addition to ammonium hydroxide, ammonium carbonate and ammonium hydrogen carbonate, and among them, ammonium hydroxide or a quaternary ammonium salt is more preferred. Specific examples of the quaternary ammonium salt include tetramethylammonium hydroxide, tetraethylammonium hydroxide, tetramethylammonium chloride and tetraethylammonium chloride, and among them, tetramethylammonium hydroxide is more preferably used.

A preferred addition amount of the basic substance varies depending upon the substance to be used and can not generally be determined, but is usually from 0.01 to 10% based on the total weight of the polishing composition. Particularly, it is preferably from 0.01 to 1.0% in a case where the polishing accelerator is an alkali metal salt, it is preferably from 0.05 to 2.0% in a case of an ammonium salt, and it is preferably from 0.5 to 5.0% in a case of piperazine or ethylene diamine. No adequate effect as a polishing accelerator can be obtained with an addition amount of less than 0.01%. On the other hand, no further improvement in the polishing performance can be expected even if the basic substance is added in an amount of at least 10%, and accordingly an addition of at least 10% is uneconomical. Further, among the above basic substances, at least two types may be used together.

Chelating Agent

The chelating agent to be used in the present invention may be one as represented by the following general formula [1] or its salt:

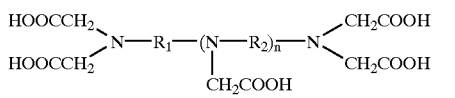

[1]

The lower alkylene group as represented by each of $R_1$ and $R_2$ in the above formula is preferably one having a carbon number of from 1 to 4, specifically, it may, for example, be a methylene group, an ethylene group, a propylene group, a methylmethylene group, a methylethylene group, an ethylmethylene group, a butylene group, a methylpropylene group or an ethylethylene group. The salt may, for example, be an alkali metal salt such as a lithium salt, a sodium salt or a potassium salt, or an ammonium salt.

Specific examples of the chelating agent include propanediaminetetraacetic acid, diethylenetriaminepentaacetic acid, triethylenetetraminehexaacetic acid, lithium propanediaminetetraacetate, lithium diethylenetriaminepentaacetate, lithium triethylenetetraminehexaacetate, potassiumpropanediaminetetraacetate, potassium diethylenetriaminepentaacetate, potassium triethylenetetraminehexaacetate, sodium propanediaminetetraacetate, sodium diethylenetriaminepentaacetate, sodium triethylenetetraminehexaacetate, ammonium propanediaminetetraacetate, ammonium diethylenetriaminepentaacetate and ammonium triethylenetetraminehexaacetate. These chelating agents may be used in combination of at least two.

The chelating agent is to prevent staining of an object to be polished due to transition metals. Specifically, it reacts with transition metal ions particularly copper ions present in the polishing composition during polishing, or before and after the polishing to form complex ions to effectively prevent metal staining on the surface of the object to be polished.

The addition amount of the chelating agent varies depending upon the type, and it is not particularly limited so long as the effect of the present invention is achieved. However, it is from 0.001 to 0.2%, preferably from 0.01 to 0.1%, more preferably from 0.03 to 0.08% based on the total weight of the polishing composition. If the addition amount is less than 0.001%, no adequate effect by the addition may be obtained, and no adequate effect of preventing metal staining may be obtained in some cases. On the other hand, if the addition amount exceeds 0.2%, such an amount is excessive, and no further effect by addition can be expected, such being uneconomical.

Water

Further, the medium of the polishing composition of the present invention is water. Water is preferably one having impurity ions reduced as far as possible, so that the above-mentioned respective components can precisely perform their roles.

Namely, water is preferably distilled water, or one having impurity ions removed by an ion exchange resin and having suspended matters removed by a filter.

Polishing Composition

The composition of the present invention is prepared usually by mixing the above respective components i.e. by dispersing the abrasive in the desired content and dissolving the chelating agent and the basic substance in water. The methods for dispersing or dissolving these components in water are optional. For example, stirring by a vane-type stirrer or supersonic dispersion may be employed for dispersion. Further, the order for mixing is optional, and either the dispersion of the abrasive or the dissolution of the chelating agent and the basic substance may be carried out first, or both may be carried out simultaneously.

The polishing composition of the present invention may be prepared, stored or transported in the form of a stock solution having a relatively high concentration, so that it may be diluted for use at the time of actual polishing operation. The above-described preferred concentration range is one for the actual polishing operation. Needless to say, in the case of adopting such a method of diluting at the time of actual use, the stock solution during the storage or transportation is a solution having a higher concentration. From the viewpoint of handling efficiency, it is preferred to prepare the composition in such a highly concentrated form.

Further, for storage and transportation of the polishing composition of the present invention, it is also possible to store it in such a state that the polishing composition is divided into two compositions. Specifically, the basic substance and the chelating agent are prepared and stored as a stock solution having a high concentration, and immediately before the polishing, the abrasive consisting of silicon dioxide is dissolved at the time of diluting the stock solution to obtain a polishing composition having a predetermined composition. Further, it is also possible to separately provide the above two types of compositions to the object to be polished, or to prepare a polishing pad preliminarily containing silicon dioxide and to provide the basic substance and the chelating agent at the time of polishing so that polishing is carried out by means of the abrasive contained in the pad.

One of major characteristics of the polishing composition of the present invention is that it contains the above chelating agent and thereby traps metals, particularly transition metals, which are present in the polishing composition or which elute from the outside to the composition at the time of polishing, to prevent staining of the object to be polished. Further, there is difference in performance of trapping transition metals depending upon the type of the chelating agent to be used. By use of particularly suitable propanediaminetetraacetic acid, diethylenetriaminepentaacetic acid or triethylenetetraminehexaacetic acid, or a sodium, potassium or ammonium salt thereof, more effective staining preventive effect can be obtained. However, the effect of such a chelating agent may be inhibited depending upon the type of the basic substance to be used together, and due care will accordingly be required for selection of the basic substance.

Now, the present invention will be described in further detail with reference to Examples and Comparative Examples. However, it should be understood that the present invention is by no means restricted to such specific Examples.

EXAMPLES 1 TO 17 AND COMPARATIVE EXAMPLES 1 TO 20

Contents and Preparation of Polishing Compositions

Colloidal silica (primary particle size: 0.045 μm) as an abrasive was prepared, and a basic substance and a chelating agent were added to the colloidal silica in amounts as identified in Table 1 to prepare polishing compositions of Examples 1 to 17 and Comparative Examples 1 to 20. Further, 0.005wt % each of Fe, Cr, Ni and Cu were added to the compositions except for the compositions of Example 1 and Comparative Example 1 to prepare compositions forcibly stained with metals. The conditions of the polishing tests were as follows.

TABLE 1

|  | Colloidal silica conc. (wt %) | Basic substance Type | Amount (wt %) | Chelating agent Type | Amount (wt %) | Forced metal staining |
|---|---|---|---|---|---|---|
| Ex. 1 | 2 | Piperazine | 1.0 | DTPA | 0.05 | Nil |
| Ex. 2 | 2 | Piperazine | 1.0 | DTPA | 0.01 | Stained |
| Ex. 3 | 2 | Piperazine | 1.0 | DTPA | 0.05 | Stained |
| Ex. 4 | 2 | Piperazine | 1.0 | DTPA | 0.3 | Stained |
| Ex. 5 | 2 | Piperazine | 1.0 | PDTA | 0.05 | Stained |
| Ex. 6 | 2 | Piperazine | 1.0 | TTHA | 0.01 | Stained |
| Ex. 7 | 2 | Piperazine | 1.0 | TTHA | 0.05 | Stained |
| Ex. 8 | 2 | Piperazine | 1.0 | TTHA | 0.3 | Stained |
| Ex. 9 | 2 | TMAH | 0.1 | DTPA | 0.05 | Stained |
| Ex. 10 | 2 | EDA | 1.0 | DTPA | 0.05 | Stained |
| Ex. 11 | 2 | KOH | 0.08 | DTPA | 0.05 | Stained |
| Ex. 12 | 2 | NaOH | 0.08 | DTPA | 0.05 | Stained |
| Ex. 13 | 2 | $NaHCO_3$ | 0.08 | DTPA | 0.05 | Stained |
| Ex. 14 | 2 | $K_2CO_3$ | 0.08 | DTPA | 0.05 | Stained |
| Ex. 15 | 2 | $(NH_4)_2CO_3$ | 0.08 | DTPA | 0.05 | Stained |
| Ex. 16 | 2 | TEAH | 0.1 | DTPA | 0.05 | Stained |
| Ex. 17 | 2 | TMAC | 0.1 | DTPA | 0.05 | Stained |
| Comp. Ex. 1 | 2 | Piperazine | 1.0 | Nil | 0 | Nil |
| Comp. Ex. 2 | 2 | Piperazine | 1.0 | Nil | 0 | Stained |
| Comp. Ex. 3 | 2 | TMAH | 0.1 | Nil | 0 | Stained |
| Comp. Ex. 4 | 2 | EDA | 1.0 | Nil | 0 | Stained |
| Comp. Ex. 5 | 2 | KOH | 0.08 | Nil | 0 | Stained |
| Comp. Ex. 6 | 2 | Piperazine | 1.0 | $EDTA.2NH_3$ | 0.05 | Stained |
| Comp. Ex. 7 | 2 | Piperazine | 1.0 | EDTA.2Na | 0.05 | Stained |
| Comp. Ex. 8 | 2 | Piperazine | 1.0 | EDTA | 0.05 | Stained |
| Comp. Ex. 9 | 2 | Piperazine | 1.0 | NTA | 0.05 | Stained |
| Comp. Ex. 10 | 2 | Piperazine | 1.0 | HIDA | 0.05 | Stained |
| Comp. Ex. 11 | 2 | Piperazine | 1.0 | PBTC | 0.05 | Stained |
| Comp. Ex. 12 | 2 | Piperazine | 1.0 | HEDTA.3Na | 0.05 | Stained |
| Comp. Ex. 13 | 2 | TMAH | 0.1 | $EDTA.2NH_3$ | 0.05 | Stained |
| Comp. Ex. 14 | 2 | EDA | 1.0 | $EDTA.2NH_3$ | 0.05 | Stained |
| Comp. Ex. 15 | 2 | KOH | 0.08 | $EDTA.2NH_3$ | 0.05 | Stained |
| Comp. Ex. 16 | 2 | MEA | 1.0 | DTPA | 0.05 | Stained |
| Comp. Ex. 17 | 2 | AEEA | 0.5 | DTPA | 0.05 | Stained |
| Comp. Ex. 18 | 2 | Pyrrolidine | 0.3 | DTPA | 0.05 | Stained |
| Comp. Ex. 19 | 2 | Quinoline | 0.3 | DTPA | 0.05 | Stained |
| Comp. Ex. 20 | 2 | Pyrazine | 0.3 | DTPA | 0.05 | Stained |

Symbols used in Table 1 have the following meanings.
TMAH: tetramethylammonium hydroxide
EDA: ethylenediamine
TEAH: tetraethylammonium hydroxide
TMAC: tetramethylammonium chloride
MEA: monoethanolamine
AEEA: N-(β-aminoethyl) ethanolamine
DTPA: diethylenetriaminepentaacetic acid
PDTA: propanediaminetetraacetic acid
TTHA: triethylenetetraminehexaacetic acid
EDTA: ethylenediaminetetraacetic acid
$EDTA.2NH_3$: diammonium ethylenediaminetetraacetate
NTA: nitrilotriacetic acid
HIDA: hydroxyethyliminodiacetic acid
PBTC: phosphonobutane tricarboxylic acid
HEDTA.3Na: trisodium hydroxyethyl ethylenediamine Polishing Apparatus and Polishing Method FIG. 1 is an oblique view illustrating a polishing apparatus used in Examples of the present invention. In FIG. 1, the polishing apparatus comprises a rotating platen 1, a wafer holder 3 and a polishing composition feeding device 8. A polishing pad 2 is bonded to the upper side of the rotating platen 1. The rotating platen 1 is rotated at a predetermined rotational speed. A ceramic plate 4 is held on the lower side of the wafer holder 3, a template 5 is bonded to the lower side of the ceramic plate 4 by means of a urethane sheet, and a silicon wafer 6 as an object to be polished is held in a hole of the template 5. The ceramic plate 4 presses the wafer 6 to the polishing pad 2 with a predetermined load, and the ceramic plate 4 rotates along with rotation of the platen 1. The polishing composition feed device 8 supplies a polishing composition 9 to the polishing pad 2 at a predetermined feed rate, and the polishing composition 9 is supplied to the space between the wafer 6 and the polishing pad 2 to polish the wafer 6. Here, the numeral reference 7 indicates a shaft.

| Polishing machine: | one side polishing machine (platen diameter: 810 mm), 4 heads |
|---|---|
| Object to be polished: | three 5 inch silicon wafers/head (held on a template bonded to a ceramic plate having an outer diameter of about 300 mm) (resistivity: 0.01 Ω · cm, crystal orientation <100>) |

-continued

| | |
|---|---|
| Load: | 350 g/cm$^2$ |
| Platen rotational speed: | 87 rpm |
| Polishing pad: | BELLATRIX K0013 (manufactured by Kanebo, Ltd.) |
| Supply rate of the polishing composition: | 6,000 cc/min (recycled) |
| Polishing time: | 20 min |

Among three silicon wafers polished by the above method in the same batch, one wafer was subjected to measurement method A and the other two were subjected to measurement method B to measure metal impurities.

Measurement Method A: Measurement of Metal Impurities on the Wafer Surface

After polishing, the wafer was washed with pure water and dried. The surface of the wafer and a naturally oxidized layer were subjected to vapor phase decomposition with hydrofluoric acid vapor and recovered by droplets containing hydrofluoric acid and a hydrogen peroxide solution, and metal impurities in the recovered liquid were quantitatively analyzed by means of inductively coupled plasma mass spectrometry (hereinafter referred to as ICP-MS). The obtained results are shown in Table 2.

TABLE 2

| | After polishing (unit: atms/cm$^2$) | | | |
|---|---|---|---|---|
| | Fe | Ni | Cu | Cr |
| Ex. 1 | 5.0E + 09 | 2.7E + 09 | <1.0E + 09 | <1.0E + 09 |
| Ex. 2 | 1.3E + 10 | 9.9E + 09 | 8.8E + 09 | 8.5E + 09 |
| Ex. 3 | 9.3E + 09 | 8.5E + 09 | 6.5E + 09 | 7.3E + 09 |
| Ex. 4 | 8.5E + 09 | 8.1E + 09 | 6.3E + 09 | 7.1E + 09 |
| Ex. 5 | 1.4E + 10 | 1.0E + 10 | 9.2E + 09 | 1.0E + 10 |
| Ex. 6 | 1.0E + 10 | 6.0E + 09 | 8.4E + 09 | 3.9E + 09 |
| Ex. 7 | 8.3E + 09 | 4.3E + 09 | 6.1E + 09 | 2.8E + 09 |
| Ex. 8 | 8.1E + 09 | 4.1E + 09 | 5.9E + 09 | 2.7E + 09 |
| Ex. 9 | 1.5E + 09 | 2.0E + 09 | 3.8E + 09 | 2.0E + 09 |
| Ex. 10 | 1.2E + 10 | 1.0E + 10 | 8.9E + 09 | 1.0E + 10 |
| Ex. 11 | 9.7E + 09 | 8.4E + 09 | 2.6E + 09 | 3.7E + 09 |

TABLE 2-continued

| | After polishing (unit: atms/cm$^2$) | | | |
|---|---|---|---|---|
| | Fe | Ni | Cu | Cr |
| Ex. 12 | 8.7E + 09 | 9.2E + 09 | 5.8E + 09 | 7.8E + 09 |
| Ex. 13 | 9.8E + 09 | 9.7E + 09 | 7.9E + 09 | 9.7E + 09 |
| Ex. 14 | 9.1E + 09 | 8.0E + 09 | 8.4E + 09 | 8.1E + 09 |
| Ex. 15 | 9.5E + 09 | 7.5E + 09 | 9.5E + 09 | 9.2E + 09 |
| Ex. 16 | 8.3E + 09 | 8.2E + 09 | 7.6E + 09 | 7.0E + 09 |
| Ex. 17 | 9.9E + 09 | 1.0E + 10 | 8.8E + 09 | 9.5E + 09 |
| Comp. Ex. 1 | 5.3E + 10 | 2.5E + 10 | 4.2E + 10 | 1.6E + 10 |
| Comp. Ex. 2 | 2.4E + 11 | 1.0E + 11 | 1.9E + 11 | 7.2E + 10 |
| Comp. Ex. 3 | 8.9E + 10 | 4.3E + 10 | 6.2E + 10 | 2.8E + 10 |
| Comp. Ex. 4 | 4.5E + 11 | 9.9E + 10 | 3.2E + 11 | 1.5E + 11 |
| Comp. Ex. 5 | 8.7E + 10 | 4.0E + 10 | 7.3E + 10 | 2.8E + 10 |
| Comp. Ex. 6 | 5.5E + 10 | 2.9E + 10 | 4.8E + 10 | 1.5E + 10 |
| Comp. Ex. 7 | 4.5E + 10 | 2.8E + 10 | 3.5E + 10 | 1.9E + 10 |
| Comp. Ex. 8 | 6.3E + 10 | 3.2E + 10 | 4.8E + 10 | 1.9E + 10 |
| Comp. Ex. 9 | 3.8E + 10 | 2.3E + 10 | 5.2E + 10 | 1.2E + 10 |
| Comp. Ex. 10 | 4.5E + 10 | 2.2E + 10 | 5.6E + 10 | 1.7E + 10 |
| Comp. Ex. 11 | 7.1E + 10 | 3.6E + 10 | 5.5E + 10 | 2.8E + 10 |
| Comp. Ex. 12 | 4.8E + 10 | 2.4E + 10 | 3.7E + 10 | 1.2E + 10 |
| Comp. Ex. 13 | 6.7E + 09 | 3.2E + 09 | 5.5E + 09 | 2.2E + 09 |
| Comp. Ex. 14 | 1.2E + 11 | 5.6E + 10 | 1.2E + 11 | 3.4E + 10 |
| Comp. Ex. 15 | 4.2E + 10 | 2.4E + 10 | 3.8E + 10 | 2.2E + 10 |
| Comp. Ex. 16 | 6.8E + 10 | 3.4E + 10 | 5.3E + 10 | 3.2E + 10 |
| Comp. Ex. 17 | 7.2E + 10 | 5.2E + 10 | 4.8E + 10 | 3.4E + 10 |
| Comp. Ex. 18 | 2.8E + 10 | 4.9E + 10 | 6.7E + 10 | 2.2E + 10 |
| Comp. Ex. 19 | 3.2E + 10 | 3.9E + 10 | 7.1E + 10 | 2.1E + 10 |
| Comp. Ex. 20 | 2.1E + 10 | 5.9E + 10 | 3.9E + 10 | 3.2E + 10 |

Measurement Method B: Measurement of Metal Impurities Diffused into the Inside of the Silicon Wafer After polishing, the surface of the wafer was washed with SC-2 (solution of hydrochloric acid (36% solution): hydrogen peroxide (31% solution): pure water=1:1:6 (volume ratio)). After the washing, one of the two wafers was subjected to a heat treatment (200° C.: 48 hours). Then, the washed wafer and the wafer subjected to a heat treatment after the washing were subjected to quantitative analysis of metal impurities by means of ICP-MS in the same manner as in the measurement method A. The obtained results are shown in Table 3.

TABLE 3

| | After washing (unit: atms/cm$^2$) | | | | After heat treatment (unit: atms/cm$^2$) | | | |
|---|---|---|---|---|---|---|---|---|
| | Fe | Ni | Cu | Cr | Fe | Ni | Cu | Cr |
| Ex. 1 | <1.0E + 09 | <1.0E + 09 | <1.0E + 09 | <1.0E + 09 | <1.0E + 09 | <1.0E + 09 | <1.0E + 09 | <1.0E + 09 |
| Ex. 2 | <1.0E + 09 | <1.0E + 09 | <1.0E + 09 | <1.0E + 09 | <1.0E + 09 | 1.3E + 09 | 1.2E + 09 | <1.0E + 09 |
| Ex. 3 | <1.0E + 09 | <1.0E + 09 | <1.0E + 09 | <1.0E + 09 | <1.0E + 09 | <1.0E + 09 | <1.0E + 09 | <1.0E + 09 |
| Ex. 4 | <1.0E + 09 | <1.0E + 09 | <1.0E + 09 | <1.0E + 09 | <1.0E + 09 | <1.0E + 09 | <1.0E + 09 | <1.0E + 09 |
| Ex. 5 | <1.0E + 09 | <1.0E + 09 | <1.0E + 09 | <1.0E + 09 | <1.0E + 09 | 1.4E + 09 | 1.2E + 09 | <1.0E + 09 |
| Ex. 6 | <1.0E + 09 | <1.0E + 09 | <1.0E + 09 | <1.0E + 09 | <1.0E + 09 | <1.0E + 09 | <1.0E + 09 | <1.0E + 09 |
| Ex. 7 | <1.0E + 09 | <1.0E + 09 | <1.0E + 09 | <1.0E + 09 | <1.0E + 09 | <1.0E + 09 | <1.0E + 09 | <1.0E + 09 |
| Ex. 8 | <1.0E + 09 | <1.0E + 09 | <1.0E + 09 | <1.0E + 09 | <1.0E + 09 | <1.0E + 09 | <1.0E + 09 | <1.0E + 09 |
| Ex. 9 | <1.0E + 09 | <1.0E + 09 | <1.0E + 09 | <1.0E + 09 | <1.0E + 09 | <1.0E + 09 | <1.0E + 09 | <1.0E + 09 |
| Ex. 10 | <1.0E + 09 | <1.0E + 09 | <1.0E + 09 | <1.0E + 09 | 1.2E + 09 | 1.3E + 09 | 1.1E + 09 | <1.0E + 09 |
| Ex. 11 | <1.0E + 09 | <1.0E + 09 | <1.0E + 09 | <1.0E + 09 | <1.0E + 09 | <1.0E + 09 | <1.0E + 09 | <1.0E + 09 |
| Ex. 12 | <1.0E + 09 | <1.0E + 09 | <1.0E + 09 | <1.0E + 09 | <1.0E + 09 | <1.0E + 09 | <1.0E + 09 | <1.0E + 09 |
| Ex. 13 | <1.0E + 09 | <1.0E + 09 | <1.0E + 09 | <1.0E + 09 | <1.0E + 09 | <1.0E + 09 | <1.0E + 09 | <1.0E + 09 |
| Ex. 14 | <1.0E + 09 | <1.0E + 09 | <1.0E + 09 | <1.0E + 09 | <1.0E + 09 | <1.0E + 09 | <1.0E + 09 | <1.0E + 09 |
| Ex. 15 | <1.0E + 09 | <1.0E + 09 | <1.0E + 09 | <1.0E + 09 | <1.0E + 09 | <1.0E + 09 | <1.0E + 09 | <1.0E + 09 |
| Ex. 16 | <1.0E + 09 | <1.0E + 09 | <1.0E + 09 | <1.0E + 09 | <1.0E + 09 | <1.0E + 09 | <1.0E + 09 | <1.0E + 09 |
| Ex. 17 | 1.2E + 09 | <1.0E + 09 | <1.0E + 09 | <1.0E + 09 | 1.2E + 09 | 1.1E + 09 | 1.1E + 09 | <1.0E + 09 |
| Comp. Ex. 1 | <1.0E + 09 | <1.0E + 09 | <1.0E + 09 | <1.0E + 09 | <1.0E + 09 | 2.1E + 10 | 8.7E + 09 | <1.0E + 09 |
| Comp. Ex. 2 | 1.1E + 09 | 1.1E + 09 | <1.0E + 09 | <1.0E + 09 | 5.5E + 09 | 7.6E + 09 | 7.6E + 09 | <1.0E + 09 |
| Comp. Ex. 3 | 1.1E + 09 | 1.1E + 09 | <1.0E + 09 | <1.0E + 09 | 4.8E + 09 | 4.2E + 09 | 8.3E + 09 | <1.0E + 09 |
| Comp. Ex. 4 | 5.2E + 09 | 3.3E + 09 | 1.4E + 09 | 1.3E + 09 | 8.9E + 09 | 6.5E + 09 | 3.8E + 10 | 1.3E + 09 |
| Comp. Ex. 5 | <1.0E + 09 | <1.0E + 09 | <1.0E + 09 | <1.0E + 09 | 4.3E + 09 | 3.8E + 09 | 6.8E + 09 | <1.0E + 09 |
| Comp. Ex. 6 | <1.0E + 09 | <1.0E + 09 | <1.0E + 09 | <1.0E + 09 | 3.8E + 09 | 5.9E + 09 | 4.5E + 09 | <1.0E + 09 |
| Comp. Ex. 7 | 2.1E + 09 | <1.0E + 09 | <1.0E + 09 | <1.0E + 09 | 2.2E + 09 | 6.7E + 09 | 6.5E + 09 | <1.0E + 09 |

TABLE 3-continued

| | After washing (unit: atms/cm$^2$) | | | | After heat treatment (unit: atms/cm$^2$) | | | |
|---|---|---|---|---|---|---|---|---|
| | Fe | Ni | Cu | Cr | Fe | Ni | Cu | Cr |
| Comp. Ex. 8 | <1.0E + 09 | <1.0E + 09 | <1.0E + 09 | <1.0E + 09 | 1.6E + 09 | 7.6E + 09 | 5.6E + 09 | <1.0E + 09 |
| Comp. Ex. 9 | <1.0E + 09 | 2.1E + 09 | <1.0E + 09 | <1.0E + 09 | 1.3E + 09 | 4.8E + 09 | 5.7E + 09 | <1.0E + 09 |
| Comp. Ex. 10 | <1.0E + 09 | <1.0E + 09 | 1.9E + 09 | <1.0E + 09 | 4.3E + 09 | 4.5E + 09 | 4.8E + 09 | <1.0E + 09 |
| Comp. Ex. 11 | <1.0E + 09 | <1.0E + 09 | <1.0E + 09 | <1.0E + 09 | 3.6E + 09 | 4.2E + 09 | 5.6E + 09 | <1.0E + 09 |
| Comp. Ex. 12 | <1.0E + 09 | <1.0E + 09 | <1.0E + 09 | <1.0E + 09 | 2.7E + 09 | 5.2E + 09 | 5.2E + 09 | <1.0E + 09 |
| Comp. Ex. 13 | 1.2E + 09 | <1.0E + 09 | <1.0E + 09 | <1.0E + 09 | <1.0E + 09 | <1.0E + 09 | <1.0E + 09 | <1.0E + 09 |
| Comp. Ex. 14 | 2.8E + 09 | <1.0E + 09 | 1.1E + 09 | <1.0E + 09 | 4.0E + 09 | 5.2E + 09 | 7.8E + 09 | <1.0E + 09 |
| Comp. Ex. 15 | <1.0E + 09 | <1.0E + 09 | <1.0E + 09 | <1.0E + 09 | 2.3E + 09 | 2.5E + 09 | 2.4E + 09 | <1.0E + 09 |
| Comp. Ex. 16 | 2.5E + 09 | 1.2E + 09 | <1.0E + 09 | 1.1E + 09 | 4.3E + 09 | 4.3E + 09 | 5.3E + 09 | 1.2E + 09 |
| Comp. Ex. 17 | 3.5E + 09 | <1.0E + 09 | 1.2E + 09 | <1.0E + 09 | 3.8E + 09 | 4.5E + 09 | 4.8E + 09 | <1.0E + 09 |
| Comp. Ex. 18 | <1.0E + 09 | <1.0E + 09 | <1.0E + 09 | <1.0E + 09 | 2.1E + 09 | 3.9E + 09 | 7.2E + 09 | <1.0E + 09 |
| Comp. Ex. 19 | 1.3E + 09 | <1.0E + 09 | <1.0E + 09 | <1.0E + 09 | 3.0E + 09 | 7.6E + 09 | 7.1E + 09 | <1.0E + 09 |
| Comp. Ex. 20 | <1.0E + 09 | <1.0E + 09 | <1.0E + 09 | <1.0E + 09 | 4.1E + 09 | 4.4E + 09 | 5.4E + 09 | <1.0E + 09 |

As evident from Table 2, in a case where no chelating agent was added, staining at a level of 10$^{10}$ atoms/cm$^2$ due to metal impurities in the polishing composition and metal staining from the polishing apparatus was confirmed even if no forced metal staining was carried out (Comparative Example 1). If the forced metal staining was carried out in such a state (Comparative Example 2), the staining tended to be remarkable (increased to a level of 10$^{11}$ atoms/cm$^2$).

Here, similar remarkable staining was observed also in a case where a basic substance other than piperazine was used (Comparative Examples 3 to 5).

In a case where the forced metal staining was conducted, the staining could be suppressed to at most 10$^{10}$ atoms/cm$^2$ in an Example wherein diethylenetriaminepentaacetic acid and piperazine were added as the chelating agent and as a basic substance, respectively (Example 2) and in Examples wherein another basic substance was added instead of piperazine (Examples 9 to 17).

However, in Examples wherein monoethanolamine or N-(β-aminoethyl)ethanolamine was added (Comparative Examples 16 and 17), staining at a level of 10$^{10}$ atoms/cm$^2$ was observed since the effect of preventing metal staining is low. It is considered that monoethanolamine and N-(β-aminoethyl)ethanolamine inhibit the effect of preventing metal staining by diethylenetriaminepentaacetic acid.

Further, similar effect of preventing metal staining could be obtained in Examples wherein propylenediaminetetraacetic acid or triethylenetetraminehexaacetic acid was used instead of diethylenetriaminepentaacetic acid as the chelating agent (Examples 5 to 8), however, in other examples such as Examples wherein ammonium ethylenediaminetetraacetate was used (Comparative Examples 6 and 13 to 15), the effect of preventing metal staining by the chelating agent could be obtained but was not adequate, even when piperazine, ethylenediamine or the like was used as the basic substance.

As evident from Table 3, the surface of the wafer was cleaned to a level of metal staining of at most 10$^9$ atoms/cm$^2$ in most cases by washing with SC-2. However, if the wafer after the washing was subjected to a heat treatment, copper which had diffused in the inside of the silicon crystals diffused to the surface again, and similar tendency before washing (after polishing) was observed.

Accordingly, particularly with respect to copper, it is found that copper diffused into the inside of the wafer can not be removed only by washing to remove copper attached to the wafer surface, and that it is necessary to polish the wafer by means of the polishing composition of the present invention to prevent metal staining.

According to the present invention, the effect of extremely effectively preventing staining of a semiconductor wafer due to metal ions at the time of polishing can be obtained. Namely, polishing of a semiconductor wafer can be carried out without metal staining by the polishing composition of the present invention, which comprises (a) silicon dioxide, (b) at least one basic substance selected from the group consisting of an inorganic salt of an alkali metal, an ammonium salt, piperazine and ethylenediamine, (c) at least one chelating agent selected from the group consisting of a compound represented by the following general formula [1] and its salt:

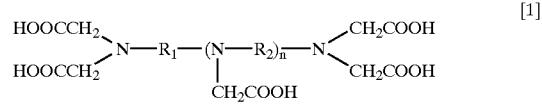

wherein each of R$_1$ and R$_2$ which are the same or different, is a low alkylene group, and n is an integer of from 0 to 4, and (d) water.

Further, polishing of a semiconductor wafer can be carried out without metal staining due to Fe, Ni, Cu and Cr by the polishing composition of the present invention wherein the silicon dioxide as the component (a) is colloidal silica, and wherein the average particle size of the colloidal silica is from 0.003 to 1 μm, and its concentration is from 0.05 to 30% based on the total weight of the polishing composition.

Further, polishing of a semiconductor wafer can efficiently be carried out without metal staining in well balance between mechanical and chemical polishing, by the polishing composition of the present invention wherein the concentration of the basic substance as the component (B) is from 0.01 to 10% based on the total weight of the polishing composition, and wherein the inorganic salt of an alkali metal is at least one member selected from the group consisting of lithium hydroxide, sodium hydroxide, potassium hydroxide, lithium carbonate, sodium carbonate, potassium carbonate, lithium hydrogen carbonate, sodium hydrogen carbonate and potassium hydrogen carbonate.

Polishing of a semiconductor wafer can be carried out without metal staining due to Fe, Ni, Cu and Cr, by the polishing composition of the present invention wherein the ammonium salt is at least one member selected from the group consisting of ammonium hydroxide, ammonium carbonate, ammonium hydrogen carbonate, tetramethylammonium hydroxide, tetraethylammonium hydroxide, tetramethylammonium chloride and tetraethylammonium chloride, and wherein the chelating agent as the component (c) is at least one member selected from the group consisting of propanediaminetetraacetic acid, diethylenetriaminepentaacetic acid and triethylenetetraminehexaacetic acid.

According to the polishing method of the present invention by means of the above polishing composition, it becomes possible to obtain a semiconductor wafer wherein staining due to transition metals at the time of polishing is prevented. Further, according to the polishing method of the present invention wherein the semiconductor wafer is at least one member selected from the group consisting of single-crystal silicon, poly-crystal silicon, silicon oxide and silicon nitride, a semiconductor wafer wherein staining due to transition metals at the time of polishing is prevented, can be obtained stably in mass production.

The entire disclosure of Japanese Patent Application No. 2001-27276 filed on Feb. 2, 2001 including specification, claims, drawings and summary are incorporated herein by reference in its entirety.

What is claimed is:

1. A polishing composition which comprises the following components (a) to (d):

(a) silicon dioxide, (b) at least one basic substance selected from the group consisting of an inorganic salt of an alkali metal, an ammonium salt, piperazine and ethylenediamine, (c) at least one chelating agent selected from the group consisting of a compound represented by the following general formula [1] and its alkali metal and ammonium salt:

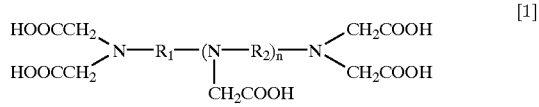

[1]

wherein each of $R_1$ and $R_2$ which are the same or different, is a lower alkylene group, and n is an integer of from 0 to 4, except that ethylene diamine tetraacetic acid and its alkali metal and ammonium salts are excluded, and (d) water.

2. The polishing composition according to claim 1, wherein the silicon dioxide as the component (a) is colloidal silica.

3. The polishing composition according to claim 1, wherein the silicon dioxide has an average particle size of from 0.003 to 1 μm, and its concentration is from 0.05 to 30% based on the total weight of the polishing composition.

4. The polishing composition according to claim 1, wherein the concentration of the basic substance as the component (b) is from 0.01 to 10% based on the total weight of the polishing composition.

5. The polishing composition according to claim 1, wherein (b) in an inorganic salt of an alkali metal and is at least one member selected from the group consisting of lithium hydroxide, sodium hydroxide, potassium hydroxide, lithium carbonate, sodium carbonate, potassium carbonate, lithium hydrogen carbonate, sodium hydrogen carbonate and potassium hydrogen carbonate.

6. The polishing composition according to claim 1, wherein (b) is an ammonium salt and is at least one member selected from the group consisting of ammonium hydroxide, ammonium carbonate, ammonium hydrogen carbonate, tetramethylammonium hydroxide, tetraethylammonium hydroxide, tetramethylammonium chloride and tetraethylammonium chloride.

7. The polishing composition according to claim 1, wherein the chelating agent as the component (c) is at least one member selected from the group consisting of propanediaminetetraacetic acid, diethylenetriaminepentaacetic acid and triethylenetetraminehexaacetic acid.

8. A method for polishing a semiconductor wafer, wherein the polishing composition as defined in claim 1 is used to prevent staining of an object to be polished due to transition metals at the time of polishing.

9. The polishing method according to claim 8, wherein the semiconductor wafer is at least one member selected from the group consisting of single-crystal silicon, poly-crystal silicon, silicon oxide and silicon nitride.

10. The polishing composition according to claim 1, wherein the silicon dioxide has an average particle size of from 0.01 to 0.5 μm.

11. The polishing composition according to claim 1, wherein the silicon dioxide has an average particle size of from 0.01 to 0.3 μm.

12. The polishing composition according to claim 1, wherein (b) is an inorganic salt of an alkali metal and its concentration is from 0.01 to 1.0% based on the total weight of the polishing composition.

13. The polishing composition according to claim 1, wherein (b) is an ammonium salt and its concentration is from 0.05 to 2.0% based on the total weight of the polishing composition.

14. The polishing composition according to claim 1, wherein (b) is piperazine or ethylenediamine and its concentration is from 0.5 to 5.0% based on the total weight of the polishing composition.

15. The polishing composition according to claim 1, wherein the concentration of component (c) is from 0.00 1 to 0.2% based on the total weight of the composition.

16. The polishing composition according to claim 1, wherein component (c) is at least one selected from the group consisting of propanediaminetetraacetic acid, diethylenetriaminepentaacetic acid, triethylenetetraminehexaacetic acid, lithium propanediaminetetraacetate, lithium diethylenetriaminepentaacetate, lithium triethylenetetraminehexaacetate, potassiumpropanediaminetetraacetate, potassium diethylenetriaminepentaacetate, potassium triethylenetetraminehexaacetate, sodium propanediaminetetreacetate, sodium diethylenetriaminepentaacetate, sodium triethylenetetraminehexaacetate, ammonium propanediaminetetraacetate, ammonium diethylenetriaminepentaacetate and ammonium triethylenetetraminehexaacetate.

17. The polishing composition according to claim 1, wherein the composition contains at least one transition metal impurity in an amount sufficient to stain an object to be polished by a polishing composition other than the polishing composition comprising said components (a) to (d).

* * * * *